United States Patent
Ellison et al.

(10) Patent No.: US 6,285,912 B1
(45) Date of Patent: Sep. 4, 2001

(54) SYSTEM FOR PHYSICALLY MOUNTING A MULTIFUNCTION USER INTERFACE TO A BASIC MULTIFUNCTION SENSOR TO ACCESS AND CONTROL VARIOUS PARAMETERS OF A CONTROL NETWORK ENVIRONMENT

(75) Inventors: David Ellison, Westport; John R. Baldwin, Newtown; Thomas J. Batko, Wallingford, all of CT (US); David D. Yu, Cresskill, NJ (US)

(73) Assignee: Hubbell Incorporated, Orange, CT (US)

(*) Notice: Subject to any disclaimer, the term of this patent is extended or adjusted under 35 U.S.C. 154(b) by 0 days.

(21) Appl. No.: 09/107,085

(22) Filed: Jun. 29, 1998

Related U.S. Application Data

(63) Continuation-in-part of application No. 08/738,044, filed on Oct. 25, 1996.

(51) Int. Cl.[7] .................................................. G08B 11/01
(52) U.S. Cl. ................................... 700/11; 700/9; 700/26
(58) Field of Search .................................. 700/11, 9, 10, 700/12, 17–20, 182, 15, 26, 23, 27

(56) References Cited

U.S. PATENT DOCUMENTS

| | | |
|---|---|---|
| 4,688,183 | 8/1987 | Carll et al. . |
| 4,703,171 | 10/1987 | Kahl et al. . |
| 5,106,325 | 4/1992 | Robinson et al. . |
| 5,115,967 | 5/1992 | Wedekind . |
| 5,146,401 * | 9/1992 | Bansal et al. ............................ 700/9 |
| 5,266,807 | 11/1993 | Neiger . |
| 5,281,961 | 1/1994 | Elwell . |
| 5,290,175 | 3/1994 | Robinson et al. . |
| 5,309,146 | 5/1994 | Kenet . |
| 5,395,042 | 3/1995 | Riley et al. . |
| 5,430,663 | 7/1995 | Judd et al. . |
| 5,479,812 | 1/1996 | Juntunen et al. . |
| 5,509,108 | 4/1996 | Yeh . |
| 5,525,846 | 6/1996 | Newell et al. . |
| 5,565,855 * | 10/1996 | Knibble .......................... 340/825.06 |
| 5,640,143 | 6/1997 | Myron et al. . |
| 5,682,328 * | 10/1997 | Roeber et al. ....................... 702/182 |
| 5,699,243 | 12/1997 | Eckel et al. . |
| 5,907,491 * | 5/1999 | Canada et al. ....................... 700/108 |
| 5,950,148 * | 9/1999 | Nakagawa et al. .................. 702/182 |
| 5,971,597 * | 10/1999 | Baldwin et al. ..................... 700/277 |

\* cited by examiner

Primary Examiner—Thomas Lee
Assistant Examiner—Rijue Mai
(74) Attorney, Agent, or Firm—William C. Roch

(57) ABSTRACT

A multifunction user interface provided as an add-on option to a more basic multifunction sensor which does not provide a display or keypad, to provide a local user interface to access and control parameters of a control network. The basic multifunction sensor provides a plurality of parameter sensors in one sensor housing, and can interface with and control operation of one or more processor control systems connected by a network bus in an occupied space networked environment. The basic sensor comprises at least an occupancy sensor, a temperature sensor, and a common network communications and control processor coupled to a common communication transceiver. This allows the basic multifunction sensor to interface with and control operation of one or more processor control systems in an occupied space networked environment. The add-on multifunction user interface comprises a display controlled by a display controller and a keypad input controlled by a keypad controller, which are electrically coupled to the communications and- control processor to provide the local user interface.

23 Claims, 15 Drawing Sheets

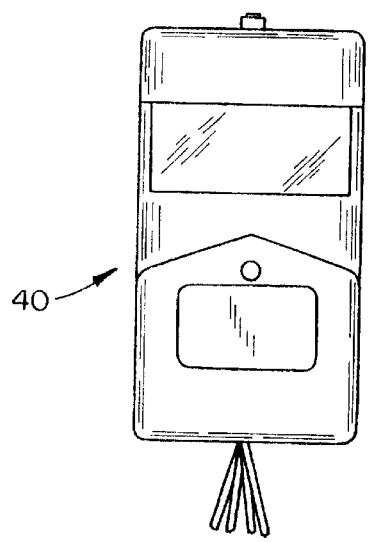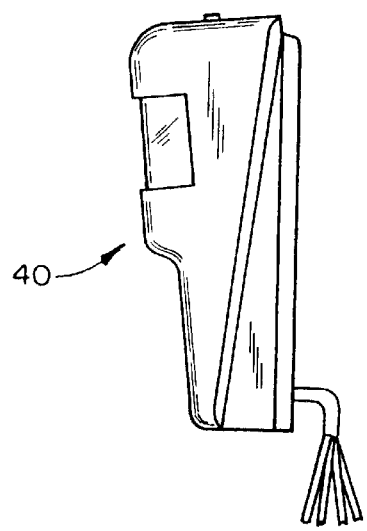
FIG.2　　　　　FIG.2A
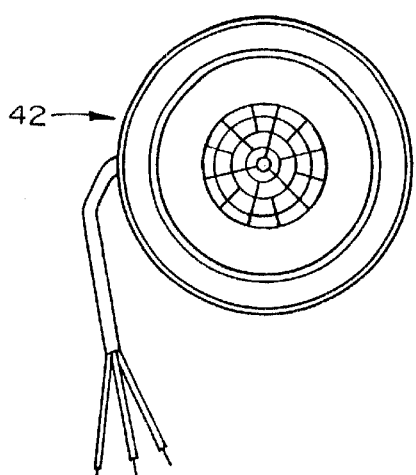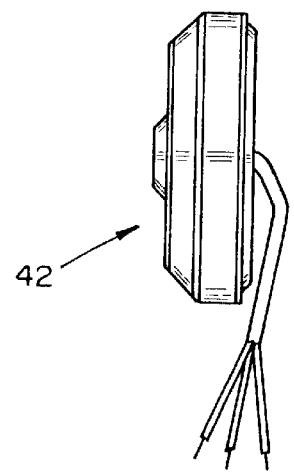
FIG.3　　　　　FIG.3A
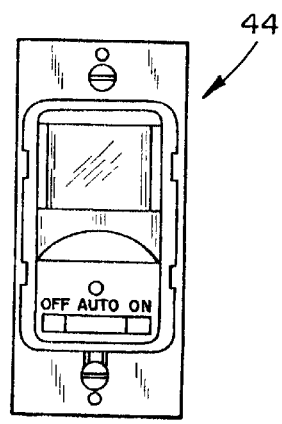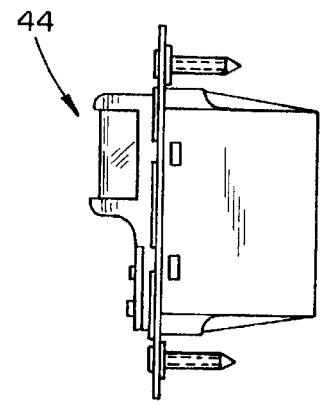
FIG.4　　　　　FIG.4A

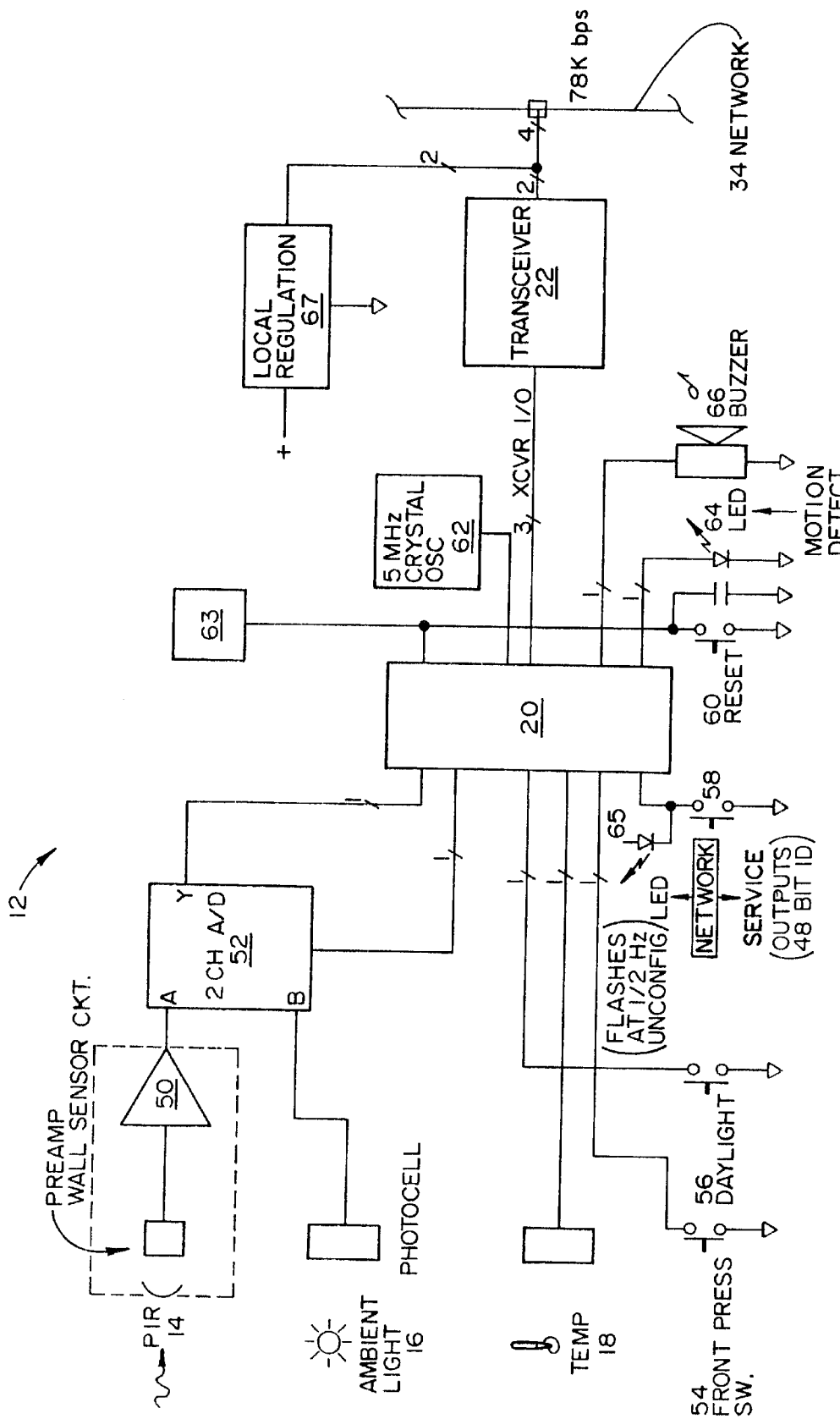

| TEMP: 100 DEG F | TEMP: 20 DEG C |
| LIGHT CH 1: 0% | LIGHT CH 2: 100% |
| LUX: 2721 | INC DEC UP DN |
| SECURITY ENABLED | SECURITY DISABLED |
| SECURITY ON | SECURITY OFF |
| OVERRIDE CH1: ON | * |
| SETBACK TEMP: 65F | TEMP: 100 DEG F |
| SCHEDULE DAY / TIME | TEMP: 20 DEG C |
| SUN ON 12:05 PM | SUN OFF 5:00 AM |
| SUNBLIND OPEN CLS | SCREEN UP DN |

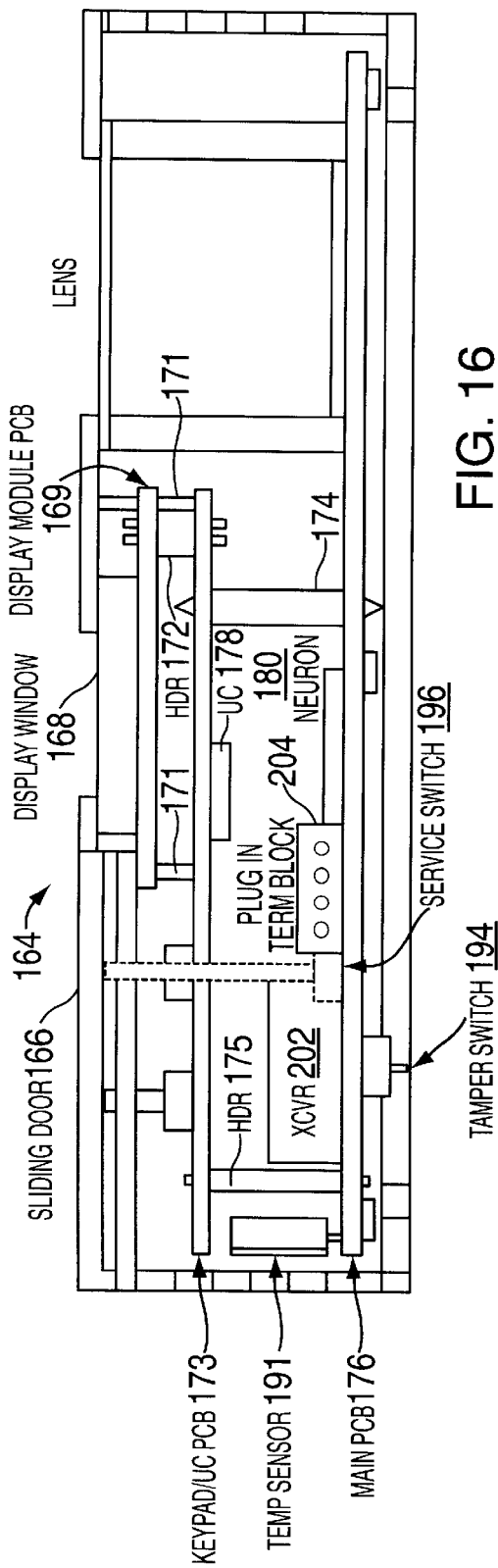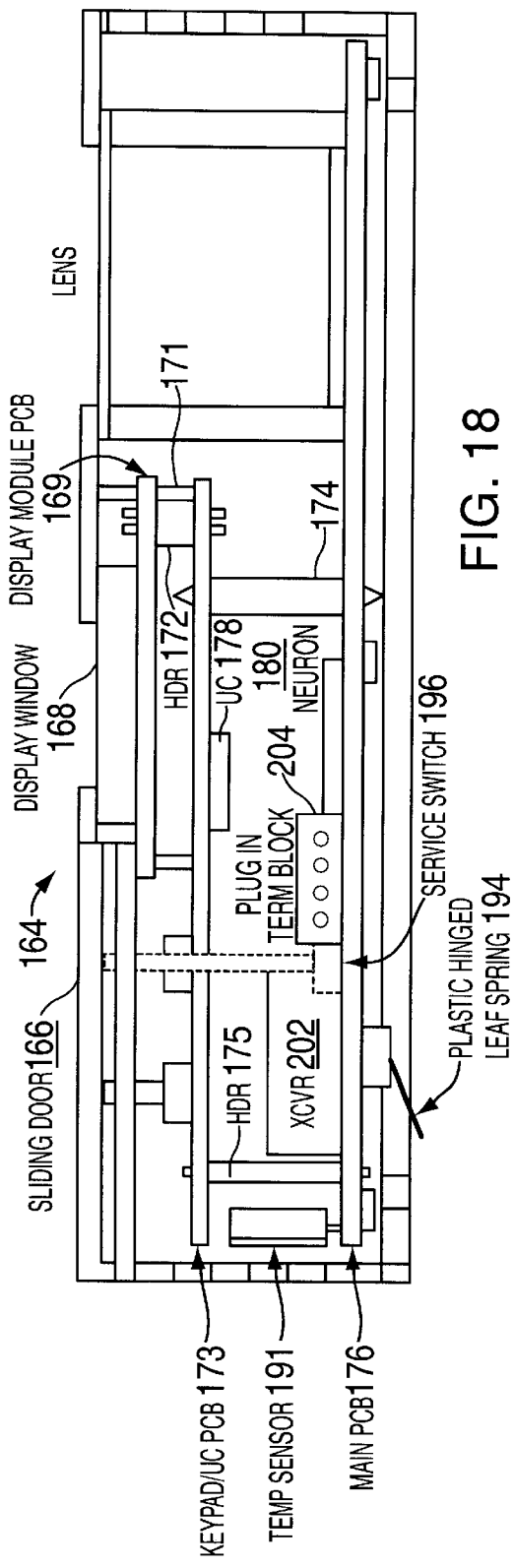

SYSTEM FOR PHYSICALLY MOUNTING A MULTIFUNCTION USER INTERFACE TO A BASIC MULTIFUNCTION SENSOR TO ACCESS AND CONTROL VARIOUS PARAMETERS OF A CONTROL NETWORK ENVIRONMENT

This patent application is a continuation-in-part application of patent application Ser. No. 08/738,044, filed Oct. 25, 1996 for a Multifunction Sensor and Network Sensor System.

BACKGROUND OF THE INVENTION

1. Field of the Invention

The present invention relates generally to a multifunction user interface and network sensor system which provides a low profile streamlined combination keypad and sensor. The multifunction user interface is provided as an add-on option to a more basic and lower cost sensor module which provides a plurality of parameter sensors in one sensor module, but does not provide a display or keypad to enable a person at the sensor module to access and control parameters of the system.

More particularly, the subject invention pertains to a multifunction user interface and network sensor system as might be utilized in an occupied space networked environment such as an automated commercial or industrial building in which sensors are installed to sense and control various parameters therein. The sensors can include an occupancy sensor, such as a passive infrared (PIR) sensor or an active infrared sensor or an ultrasonic sensor, a temperature sensor, an ambient light sensor, a relative humidity sensor, a $CO_2$ sensor, and other parameter sensors.

It would be desirable to provide a plurality of such parameter sensors in one sensor module which can interface with one or more distributed common bus processor control systems to control operation of security systems, energy management systems, etc. in the occupied space networked environment. Such processor control systems are available commercially which incorporate networking such as an Echelon LONWORKS system, CEBus, BacNet, etc.

2. Discussion of the Prior Art

Traditionally, separate sensors have been used for occupancy sensing, ambient light sensing, temperature sensing, etc. in separate lighting control systems, Heating, Ventilation and Air Conditioning (HVAC) control systems, Demand Side Management (DSM) electrical load control systems, and security systems, although modules combining occupancy sensing and ambient light sensing have been used previously.

SUMMARY OF THE INVENTION

Accordingly, it is a primary object of the present invention to provide a multifunction user interface which provides a low profile streamlined combination keypad and sensor as an add-on option to a more basic and lower cost sensor.

A further object of the subject invention is the provision of a multifunction user interface which provides major cost benefits in building and installing automatic control systems in automated commercial or industrial buildings, with additional major cost savings in installation and binding (software connectivity allowing interoperability) of a node to other control nodes in a control system network. The cost of one multifunction sensor module, as compared with separate sensor modules for occupancy, ambient light, and temperature, should greatly reduce the equipment and installation costs. The cost savings result from shared usage of common hardware, software and enclosures, such as a common network control and communications processor and a common communication transceiver between multiple sensors, and the elimination of multiple sensor housings, as well as from the more simplified installation procedures for a single multifunction sensor.

In accordance with the teachings herein, the present invention provides a multifunction user interface provided as an add-on option to a more basic multifunction sensor which does not provide a display or keypad, to provide a local user interface to access and control parameters of a control network. The basic multifunction sensor provides a plurality of parameter sensors in one sensor housing, and can interface with and control operation of one or more processor control systems connected by a network bus in an occupied space networked environment. The basic sensor comprises an occupancy sensor and a temperature sensor, and a common network communications and control processor coupled to a common communication transceiver. The basic multifunction sensor can interface with and control operation of one or more distributed processor control systems for control of the occupied space networked environment. The multifunction user interface comprises a display and a keypad input, controlled by a keypad/display controller, which are electrically coupled to the communications and control processor, to provide a local user interface to access and control parameters of the control network.

In greater detail, the multifunction user interface is provided on a plug-in printed circuit board which plugs into and interfaces with a main printed circuit board of the basic multifunction sensor. The plug-in printed circuit board comprises a keypad/controller printed circuit board, on which is mounted a display/controller printed circuit board. The plug-in printed circuit board is mounted by supports and an electrical header connector to the main printed circuit.

The basic multifunction sensor and the multifunction user interface allow a range of products to be built, from a lower end product to minimize cost and provide basic functionality, to a high end product with a rich feature set including user interfaces for local control and additional parameter sensor inputs.

The keypad includes generic keys to allow the display to allocate different functional assignments, in a menu driven mode, to the generic keys which in turn select and control an appropriate function. Scheduler/real time clock data is imported from other nodes on the network bus to select time of day or seven day timing functions. Additional parameter sensors are connectable to the multifunction user interface unit.

In some embodiments the display can comprise a graphical touch panel which utilizes and displays a graphical icon based touch and enter input. A control function is selected by touching the display, and then controlled by sliding a graphical icon thereon. The multifunction user interface enclosure housing includes a window placed in front of a passive infrared occupancy sensor which provides an aesthetically smooth continuation of the enclosure housing. The keypad is located behind a door to permit access to individual controls of the keypad, and the digital display is centrally located above the door.

A tamper switch is mounted to the back of the main printed circuit board, to contact a mounting surface, such that if the multifunction user interface unit is removed from its mounted position, the tamper switch signals an input to the control processor. In alternative embodiments, the tamper switch can comprise a spring-loaded push button switch or a remote actuator hinged leaf spring, to ensure that a contact point is available by placing the hinged leaf spring at a mounting boss of an electrical outlet box. The main printed circuit board is mounted in a front housing cover, such that the tamper switch reports an alarm signal if the entire unit is removed from its mounting or if the sensor front housing cover is removed.

The main printed circuit board includes the network communications and control processor, an ac/dc power supply, a memory containing programs for the control processor, a clock, inputs from parameter sensors, and the control processor connected by the transceiver to interface with other nodes of the control network. The transceiver interfaces through a plug-in terminal block with other nodes of the control network, and the transceiver is interchangeable to allow the utilization of different transceiver types, depending upon the particular type of network. The keypad microcontroller converts a serial input/output from the common network control processor to a parallel input/output for the display. The common network control processor is connected to a service switch, and a circuit allows the service switch to be shared by an application input/output port and also for service operations.

The basic multifunction sensor module includes a smart power supply circuit which provides auto compensation for an internal heating error due to a range of power supply operating voltages. This allows the sensor circuit to be connected to an input range of 12–24Vac or dc without the need for a user to manually select a specific setting, to minimize internal thermal dissipation. In one embodiment, the smart power supply circuit utilizes the network processor to monitor the power supply filtered but unregulated voltage, and dynamically regulates the input power by current limit resistor switching to minimize power loss. The smart power supply circuit selects 1 of 7 possible power levels in dependence upon the input by selecting 1 of 7 possible combinations of current limit resistors R1, R2, and R3, to minimize internal thermal dissipation.

BRIEF DESCRIPTION OF THE DRAWINGS

The foregoing objects and advantages of the present invention for a multifunction user interface may be more readily understood by one skilled in the art with reference being had to the following detailed description of several preferred embodiments thereof, taken in conjunction with the accompanying drawings, particularly by FIGS. 12–21 which specifically illustrate the multifunction user interface of the present invention, and in which:

FIGS. 2, 3 and 4 illustrate three different types of multifunction sensors pursuant to the present invention, a wall-mount multifunction sensor, a ceiling mount multifunction sensor, and a wall switch multifunction sensor, each of which could be utilized in the multifunction network sensor system of FIG. 1;

FIG. 5 is a block diagram of the major electronic components of a multifunction sensor pursuant to the present invention;

FIG. 16 is a sectional side view of the package layout of the multifunctional keypad display with a first embodiment of a spring-loaded pushbutton tamper switch.

FIG. 18 is a sectional side view of the package layout of the multifunctional keypad display with a second embodiment of a hinged leaf tamper spring.

DETAILED DESCRIPTION OF THE DRAWINGS

Figure 1:
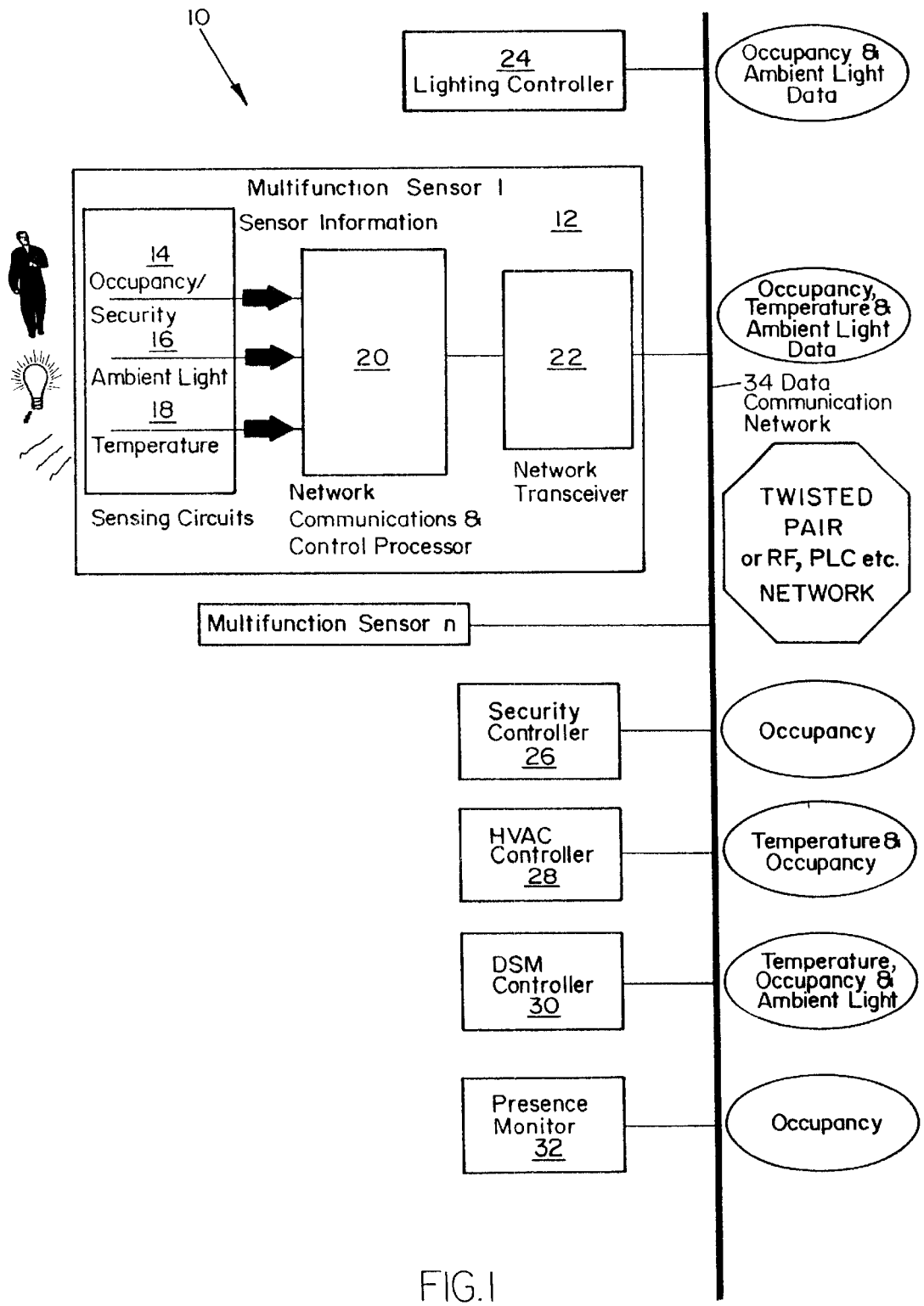
FIG. 1 is a block diagram of a multifunction network sensor system pursuant to the present invention which comprises multifunction sensors, each of which generally includes at least an occupancy sensor, a temperature sensor and an ambient light sensor, all of which share the same network communications and control processor, and the same network communication transceiver, and a plurality of energy management and security controller systems, all of which are connected to a common data communication network.

Referring to the drawings in detail, FIG. 1 is a block diagram of a multifunction network sensor system 10 pursuant to the present invention which comprises multifunction sensors 12, each of which generally includes at least an occupancy sensor 14, an ambient light sensor 16, and a temperature sensor 18, all of which share the same network communications and control processor 20 and the same communication transceiver 22. The multifunction network sensor system 10 further comprises energy management and security controller systems 24, 26, 28, 30 and 32, and a common data communication network 34 which connects to all of the multifunction sensors and controller systems.

Different multifunction sensors 12 (1 to n) can be placed at various locations throughout a building, typically several on each floor level. The multifunction sensors are typically housed in small plastic enclosures such as those illustrated in FIGS. 2, 3 and 4. The occupancy (or motion) sensor 14 technology can be passive infrared (PIR), IR, ultrasonic, sonic, RF, microwave, radar or any other effective occupancy sensing technology. One preferred version is a Passive Infrared (PIR) design which can be used in hallways, rooms/offices or open office cubicles, each provided with a lens designed to optimize the field of view and motion detection for that particular application.

Each multifunction sensor 12 is assigned a unique location address, and is connected to the common data communication network 34 located throughout the building to form a local operating network. Each multifunction sensor 12 can send or receive data, including its own unique address, over the data communication network 34 on a continual periodic basis, such as every 5 seconds, or can respond when polled by an energy management or security controller.

The data communication network 34 is also accessed by control systems requiring such data such as: one or more lighting controllers 24 which require data from one or more of the multifunction sensors 12 on occupancy and ambient light; one or more security controllers 26 which require data from one or more of the multifunction sensors 12 on occupancy or intrusion; one or more HVAC controllers 28 which require data from one or more of the multifunction sensors 12 on occupancy and temperature; one or more DSM controllers 30 which require data from one or more of the multifunction sensors 12 on occupancy, temperature and ambient light; and one or more presence monitors 32 which require data from one or more of the multifunction sensors 12 on occupancy. The lighting, HVAC, DSM and security controllers can comprise one composite controller or individual controllers connected to the common data bus.

The data communication network 34 can use any suitable technology or physical transmission media such as twisted wire pair, power line carrier (PLC), RF, fiber optics, etc., and can employ any suitable common bus data communications protocol such as LONWORKS, CEBus, BacNet, etc.

Each multifunction sensor 12 will generally include sensors for detecting occupancy, ambient light level, and temperature, and can provide optimum cost/function design variations by using all three, any two, or any one of these three basic sensing functions, depending upon the user requirements/application. Each multifunction sensor can also include additional sensors for detecting relative humidity, $CO_2$ heat, smoke and other parameters. However, it should be noted that the mounting and exposure requirements of the diverse parameter sensors in one sensor module are often quite different, such that it is sometimes difficult to mount the diverse sensors in a common sensor module. For instance, a temperature sensor should be mounted to be open and exposed to a flow of air from the environment of a room being monitored, while a passive infrared occupancy sensor should be mounted so as not to be exposed to a flow of air from the environment of the room being monitored. The temperature sensor should also be insulated or shielded from direct exposure to and heat loading from sunlight. Patent application Ser. No. 08/705,778, filed Aug. 30, 1996, discloses and teaches compatible mounting arrangements for a temperature sensor and a passive infrared sensor.

The present invention can use a passive infrared (PIR) sensor such as pyro sensor model no. RE03HBBEC, manufactured by Nippon Ceramic Co., Ltd. of Japan, which detects electromagnetic radiation in the range of 8 to 14 microns. The pyro sensor can be connected to an amplifier such as a dual op-amp circuit model no. TLC27L2CD manufactured by Texas Instruments Inc. of Dallas, Tex.

A preferred type of multifunction passive infrared occupancy sensor is described in detail in copending patent application Ser. No. 08/738,045, for Multifunction Occupancy Sensor, filed on Oct. 25, 1996, the entire disclosure of which is hereby expressly incorporated by reference herein.

FIGS. 2, 3 and 4 illustrate three different types of multifunction sensors pursuant to the present invention, a wallmount multifunction sensor 40, a ceiling mount multifunction sensor 42, and a wall switch multifunction sensor 44, each of which could be utilized in the multifunction network sensor system of FIG. 1. The wallmount multifunction sensor 40 is similar to the wall switch multifunction sensor 44, except that the wall switch multifunction sensor 44 mounts recessed in a wall switch receptacle box rather than flush upon a wall. The ceiling mount multifunction sensor 42 is similar to units 40 and 44 electrically, but generally will not include a temperature sensor and a front press switch, as shown in FIGS. 4 and 5.

The different wallmount and ceiling mounted multifunction sensors and the segmented lens arrays for the different multifunction sensors are described in detail in copending patent application Ser. No. 08/736,864, for Multiple Optical Designs For A Multifunction Sensor, filed on Oct. 25, 1996, the entire disclosure of which is hereby expressly incorporated by reference herein.

FIG. 5 is a block diagram of the major electronic components of a multifunction sensor pursuant to the present invention. The multifunction sensor 12 includes an occupancy sensor in the form of a Passive Infrared (PIR) sensor 14, which may particularly be the type of sensor described in copending patent application Ser. No. 08/738,045, for Multifunction Occupancy Sensor. This type of PIR occupancy sensor can function in a dual mode as either a security occupancy sensor or as an energy management occupancy sensor as disclosed and taught in patent application Ser. No. 08/738,045. The output of PIR sensor 14 is directed through a preamplifier 50 and forms one input to a two channel A/D converter 52. An ambient light sensor 16, which maybe any suitable type of photodetector, forms a second input to the A/D converter 52. In alternative embodiments, the light sensor may be analog or digital, e.g. light to frequency, and the two channel A/D converter 52 might be replaced by a four channel A/D converter, or an A/D converter having any suitable number of channels. A temperature sensor 18, which maybe a model DS1620 or model DS1820 as available from Dallas Semiconductor, incorporates therein its own conversion from temperature to digital serial output. The multifunction sensor also includes a front press switch 54, which is in the form of a local on/off override switch, and a second press switch 56 which is a daylight set switch and enables a local setting of the ambient light as desired. Other suitable sensors such as a $CO_2$ sensor or a relative humidity sensor or time of day information may also form suitable inputs to this circuit.

The outputs from the A/D converter 52, the temperature sensor 18, and the switches 54 and 56 form inputs to a network communications and control processor 20, which may be a Neuron processor, model 3150 or 3120, as is commercially available from Motorola. A further network service switch 58 is provided for installation of the multifunction sensor when the multifunction sensor is being installed as a node on a network and outputs a unique 48 bit ID particular to the communication and control processor. A press reset switch 60 also forms an input to the processor 20, along with a 5 MHZ crystal oscillator clock 62, and a low voltage drop out detector/power supply supervisory circuit 63. A regulated power supply 67 supplies power to the circuit in general. The outputs of the processor 20 include an output to an LED 64, indicating motion detection, an LED 65 indicating service, and a buzzer 66, if required, to indicate a prelight out warning and/or sensor modes of operation. The processor 20 communicates with the multifunction network sensor system via a transceiver 22, which may be a model FTT-10A, available from Echelon. The output of the transceiver 22 is directed over the data communication network 34 which can be a twisted wire pair, at a typical data rate of 78 Kbps. For a ceiling mounted unit 42, the temperature sensor 18, front press switch 54, and daylight press switch 56 would normally be omitted.

In general, a network based multifunction sensor comprises a single mounted enclosure which provides sensor inputs to the network, such as a PIR or ultrasound occupancy sensor, an ambient light sensor such as a photocell, a temperature sensor, an analog to digital (A/D) converter, installer interface network controls, and one or more network transceivers configurable to any function. For instance, security might be provided in an entirely separate network, and second transceiver would be provided for the security network. The multifunction sensor can include less or more sensors than the three basic types of sensors mentioned hereinabove. The design considerations are to reduce costs by minimizing different product types, enclosures, circuit hardware which is mutually exclusive (e.g. Neuron, transceiver) and installation time. Network hardware and software implementations use an appropriate network controller and transceiver e.g. Neuron controller and FTT-10A transceiver for LONTALK protocol, or CEBus network with a CEWay controller including powerline transceiver, etc. The network parameters are defined by the specific network protocol.

Figure 6:
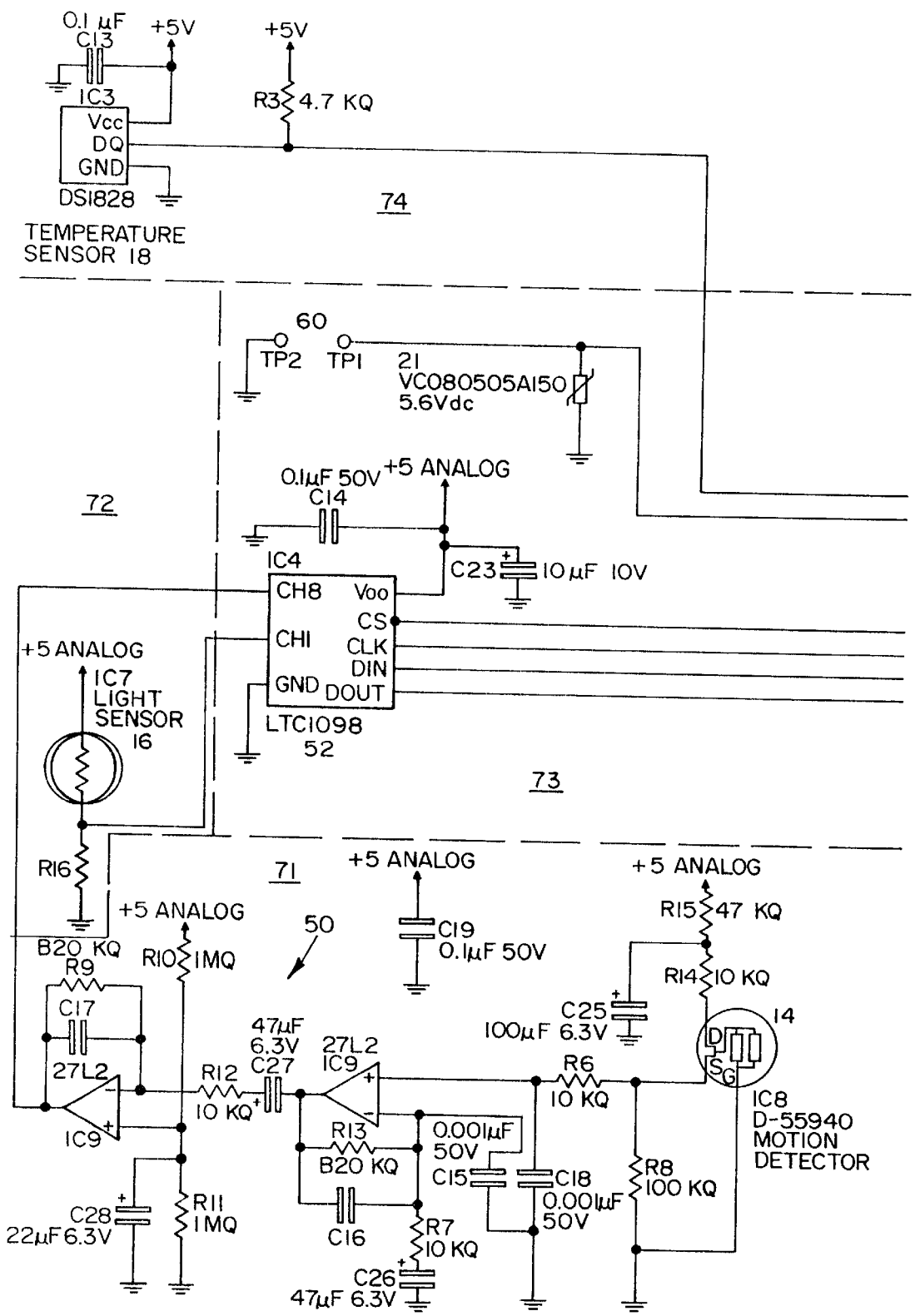
FIGS. 6 and 7 together form an electrical schematic diagram of one designed embodiment of a multifunction sensor pursuant to the present invention.
Figure 7A:
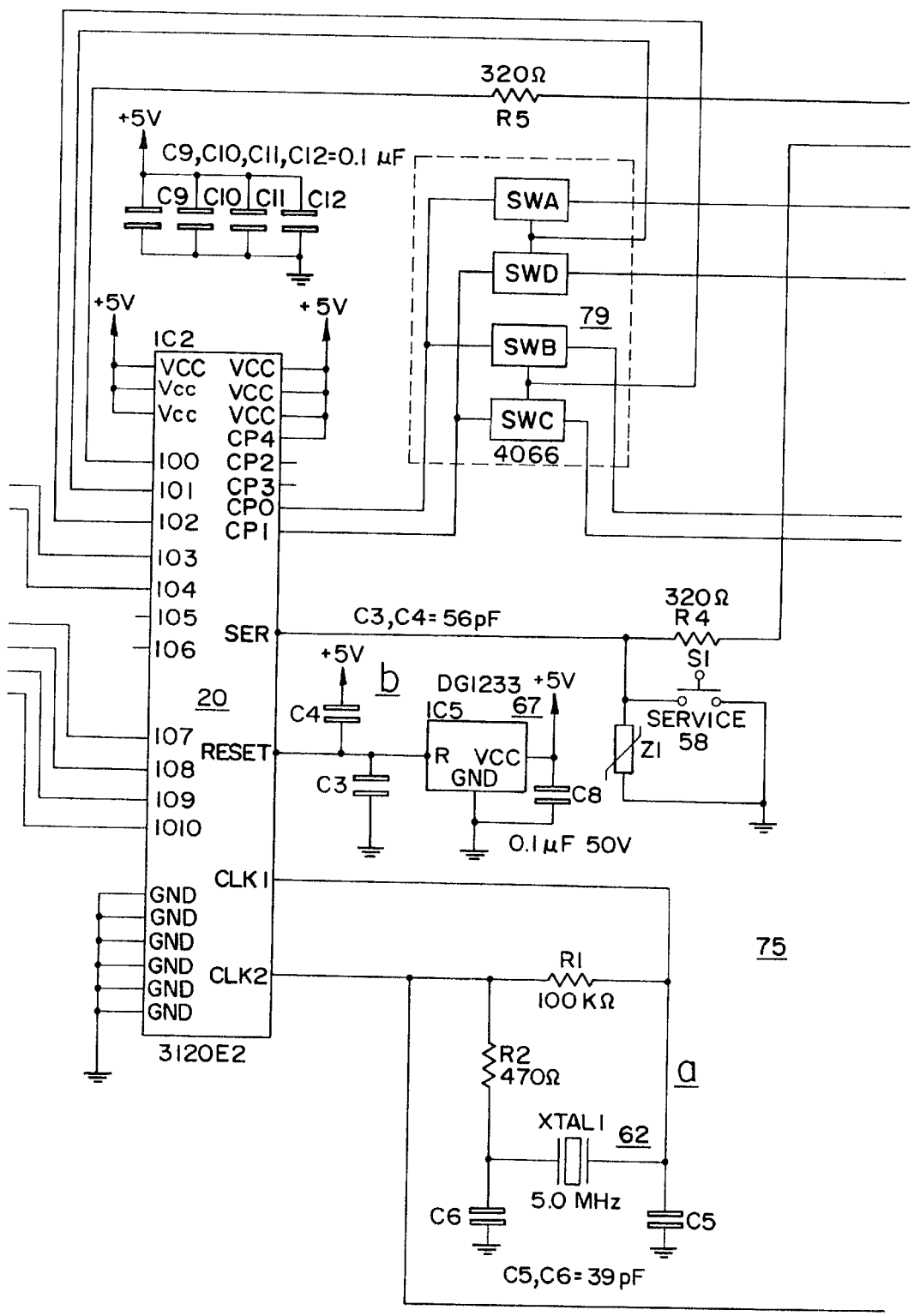
Figure 7B:
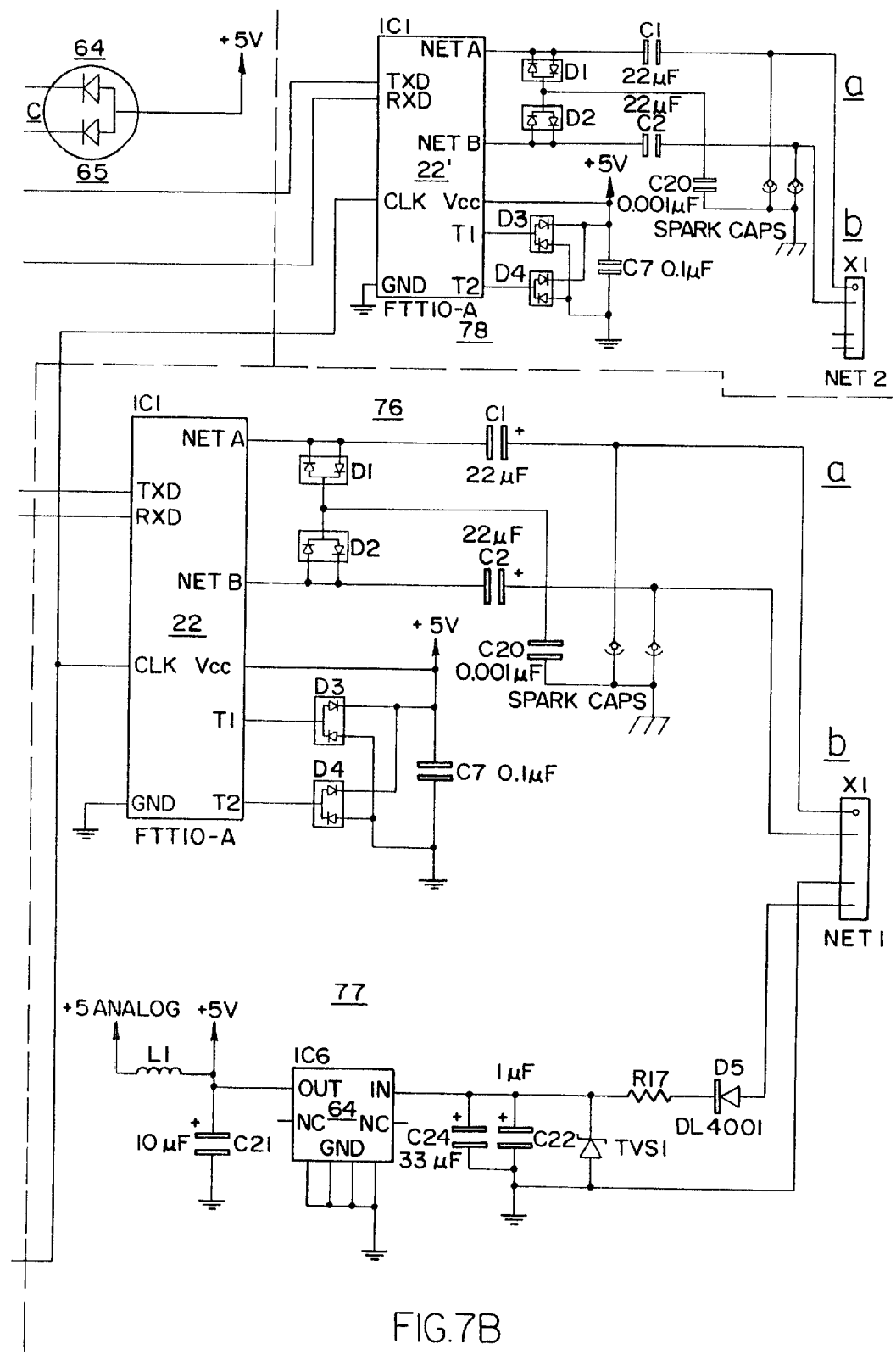

FIGS. 6 and 7 together form an electrical schematic diagram of one embodiment of a multifunction sensor pursuant to the present invention. The electrical schematic diagram of FIGS. 6 and 7 includes the components indicated generally in FIG. 5, and for explanation purposes is divided by dashed lines into sections 71–79.

A section 71 includes the passive infrared (PIR) occupancy sensor 14 (IC8), functioning in a multimode manner as an energy management sensor and/or security sensor.

A section 72 includes an ambient light (AL) sensor 16 (IC7), which provides light level output in lux and/or footcandles of the space.

A section 73 includes an analog to digital converter 52 (IC4) which receives analog inputs from the PIR sensor 14 and AL sensor 16, and converts them to digital outputs for interfacing with the microprocessor.

A section 74 includes a temperature sensor (TS) 18 (IC3), which converts space temperature to a digital serial output signal.

A section 75 includes a microprocessor (uP) 20 which includes data communications and control functions such as processing of LONTALK protocol, the LonWorks Neuron processor 3120 or 3150, or CeBus protocol, such as Intel 8051 processor and CEway, and includes the following subcircuits:

a. an oscillator, microprocessor clock 62;
 b. a low voltage dropout detector/supply supervisory circuit 67 (IC5), which controls uP reset line during power up/down and unstable transitions;
 c. a service/motion detect LED1 64 and service switch S1 58, bicolor red/green LED, red indicates service mode, green indicates motion detect (flash with motion). The switch (momentary) tells the uP to output the unique device ID e.g. Neuron 48 bit ID code.

A section 76 includes the transceiver 22 network interface and connection. The transceiver converts uP serial I/O and interfaces it to the appropriate network e.g. Free Topology (FTT-10A) 1C1, Twisted Pair (TPT), Power Line (PLT), RF, IR . . . etc. In subcircuit a, the network interface provides conditioning and protection between the units transceiver and the network. In subcircuit b, the connection provides connectivity to the physical network e.g. terminal block, RJ11 phone connector . . . etc.

A section 77 includes the power supply which provides appropriate voltage(s) and current(s) to supply the application.

A section 78 includes a second transceiver, network interface and connection, to provide a second network connection.

A section 79 includes a network selector switch which switches the appropriate sensor information to the correct network.

Figure 8:
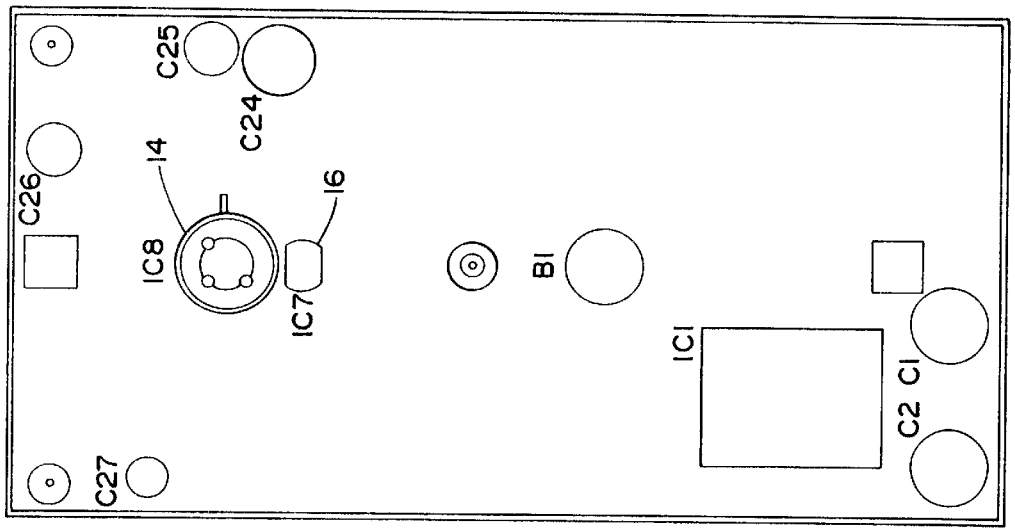
FIGS. 8 and 9 are respectively front and back views of one designed embodiment of a printed circuit board for a multifunction sensor pursuant to the present invention, and illustrate the temperature sensor and passive infrared sensor mounted on opposite sides of the PC board.
Figure 9:
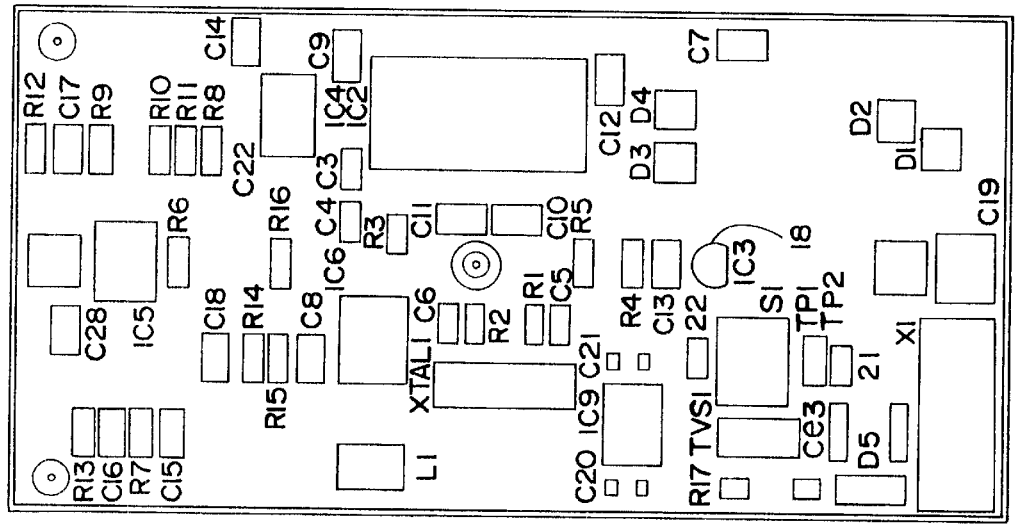

FIGS. 8 and 9 are respectively front and back views of one designed embodiment of a printed circuit board for a multifunction sensor pursuant to the present invention, and illustrate the temperature sensor 18 (1C3) and passive infrared sensor 14 (1C8) mounted respectively on opposite back and front sides of the PC board. The light sensor 16 (1C7) is also mounted adjacent to the PIR sensor 14. The temperature sensor should be mounted to be exposed to a flow of air from the environment of a room being monitored, while the passive infrared occupancy sensor should be mounted so as not to be exposed to a flow of air from the environment of the room being monitored. The temperature sensor should also be insulated or shielded from direct exposure to and heat loading from sunlight. Patent application Ser. No. 08/705,778, filed Aug. 30, 1996, discloses and teaches compatible mounting arrangements for a temperature sensor and a passive infrared sensor, and in particular discloses in FIGS. 1–3, 5 and 6 suitable arrangements for the PC board of FIGS. 8 and 9.

Figure 10:
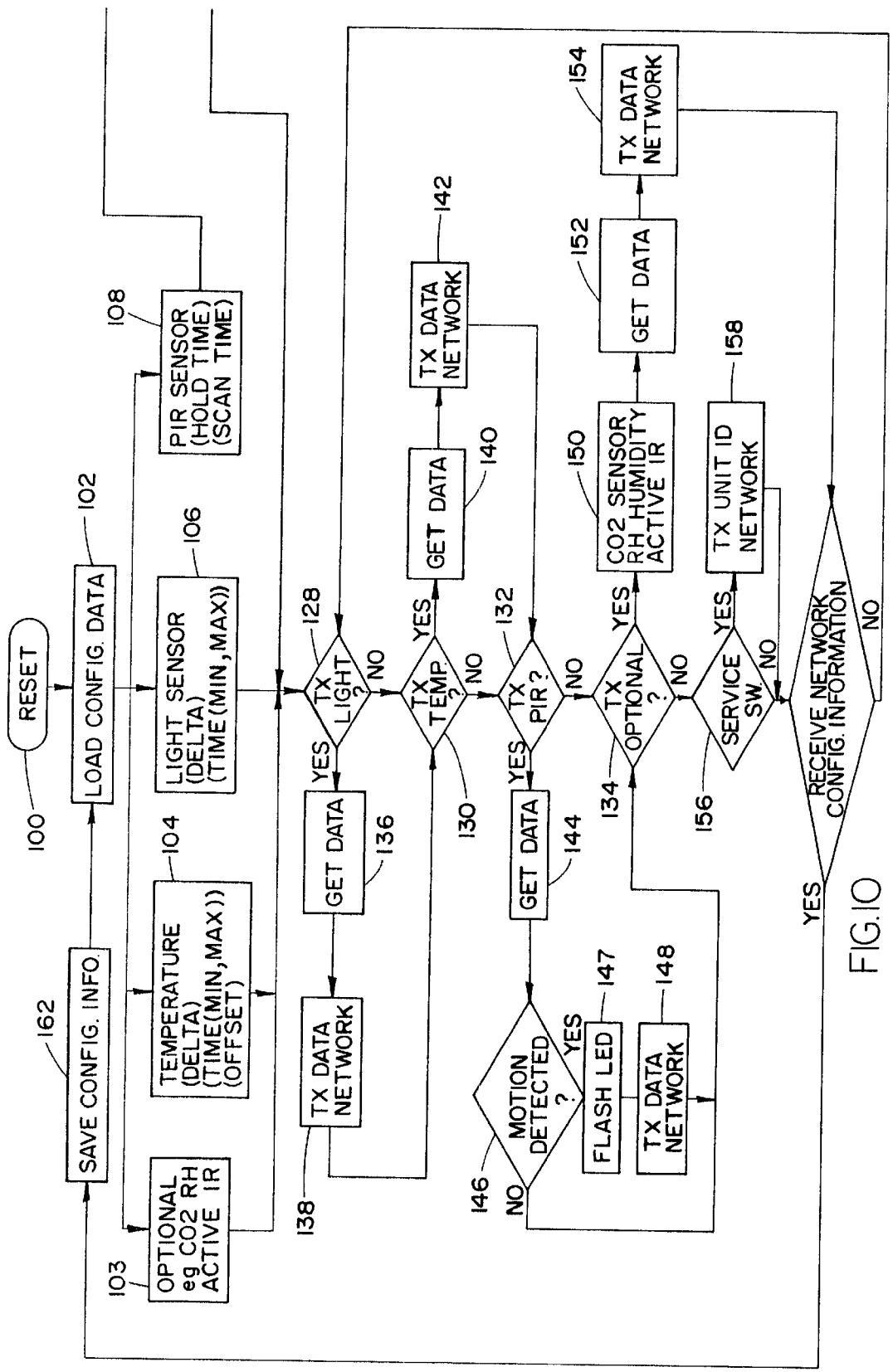
FIGS. 10 and 11 together form a logic flow diagram for operation of a multifunction sensor pursuant to the present invention.
Figure 11:
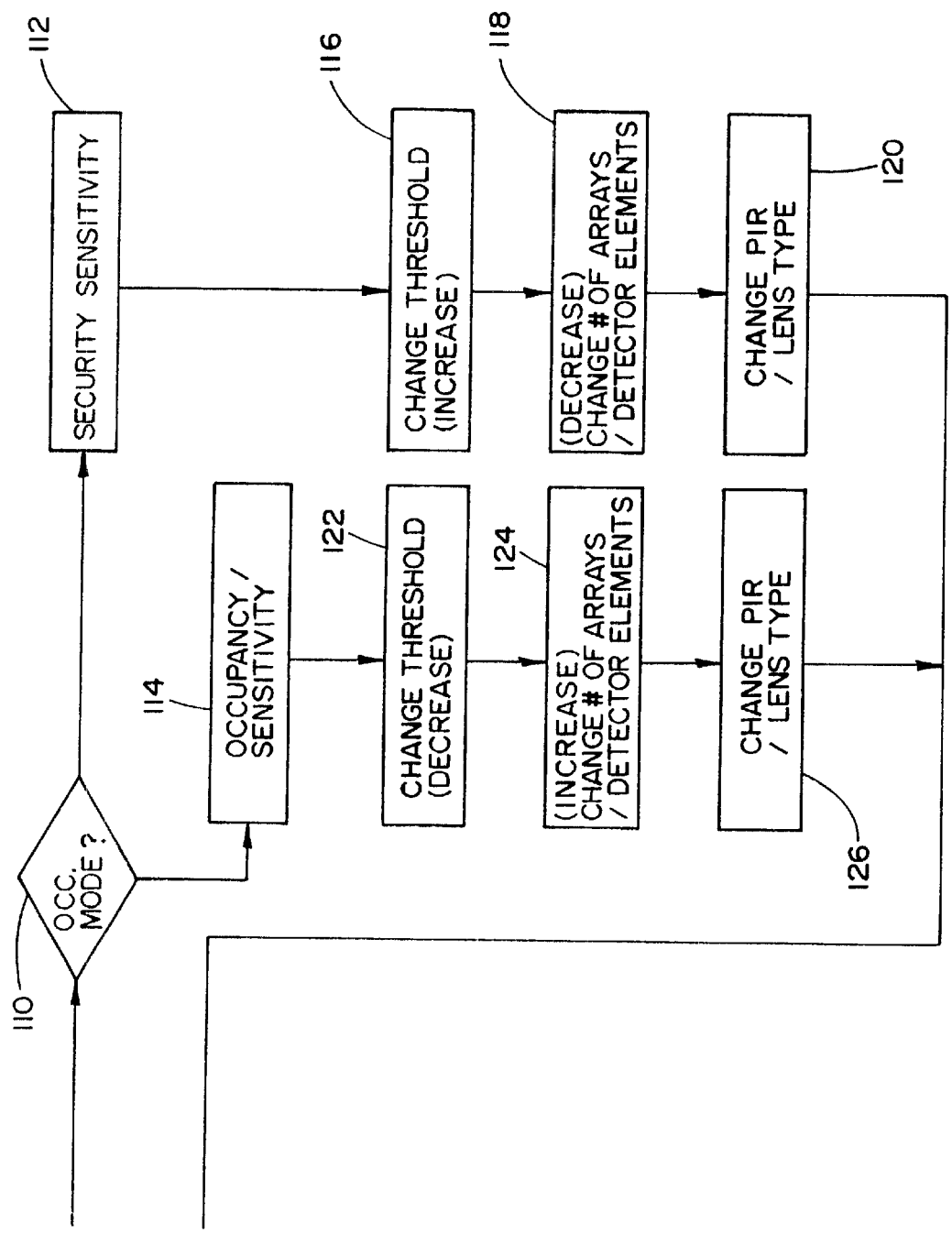

FIGS. 10 and 11 together form a logic flow diagram for operation of a multifunction sensor pursuant to the present invention. A reset block 100 is basically an initialization of the multifunction sensor, and is followed by a load configuration data block 102 which includes the setups for the multifunction sensor, such as definitions for inputs/outputs and definitions of constants.

From block 102, the logic flow diagram branches into an optional block 103 and three blocks 104, 106 and 108 dealing respectively with the temperature sensor, light sensor and occupancy PIR sensor.

The block 104 includes the routine for measuring temperature, and includes configuration for outputting to the network a temperature only when a specified difference (delta) in temperature is reached, and further includes minimum and maximum times for how often temperature is outputted to the network, and an offset to provide for temperature compensation as required. Accordingly, depending upon the rate or magnitude of change of temperature, the actual temperature outputted by the temperature sensor block 104 might be less than or greater than the temperature as sensed within the enclosure.

The block 106 includes the routine for measuring ambient light, and outputs light sensor differences (delta), along with minimum and maximum times of how often the light level is outputted to the network, and a calibration factor. The light sensor routine output from block 106 will generally be different from the actual light sensor output, with changes in the output being held within set limits. The calibration factor provides an offset to compensate for different factors such as the lens material, a nonlinear photodetector slope, etc.

The PIR sensor routine 108 includes a configuration on how often occupancy updates occur to the network. The scan checks if motion is pending during other routine processing.

To the right of PIR routine 108, a decisional mode block 110 determines which of two modes the occupancy sensor is operating in, a security sensor mode in which case the routine proceeds to block 112, or an energy management mode in which case the routine proceeds to block 114. These different operational modes are described in greater particularity in patent application Ser. No. 08/738,045. The security sensing mode 112 sets a higher threshold value for the output of the PIR sensor, whereas the energy management mode 114 sets a lower threshold for operation of the PIR sensor. Accordingly, following the security sensing mode block 112, in block 116 the threshold is increased. It may also be desirable in the security sensing mode to increase the optical sensitivity of the occupancy sensor for reasons explained in detail in patent application Ser. No. 08/738,045.

In the energy management occupancy mode indicated by block 114, in the following change threshold block 122, the threshold of the detection circuit is decreased.

Optional block 103 is included in the logic flow diagram in the event additional parameter sensors are added, such as a $Co_2$ sensor or a relative humidity sensor or an active infrared sensor.

Following blocks 103, 104, 106 and 120 or 126, the logic flow diagram proceeds to decisional block 128. The decisional block 128 concerns transmission of data on the sensed ambient light level. This is followed in the logic flow diagram by a decisional block 130 concerning the transmission of data on temperature, which is followed by the decisional block 132 concerning the transmission of data on occupancy, which is followed by the decisional block 134 concerning the transmission of optional data such as data from a $CO_2$ sensor, relative humidity sensor or active infrared sensor.

Returning to decisional block 128, if data on the sensed ambient light level is to be transmitted, the logic flow diagram branches to the left to block 136 to obtain the data from the A/D converter which converts the detected ambient light level to a digital signal, and then to block 128 to transmit the data over the data transmission network 34 wherein the protocol of the communication network is utilized for the data transmission. The data is transmitted over the communication network using the appropriate protocol for the network. For instance in the Echelon LON-WORKS system, this is referred to as SNVT, standing for System Network Variable Type.

From either a No decision in block 128 or block 138, the logic flow diagram proceeds to the transmit temperature decisional block 130, and if temperature data is to be transmitted, the logic flow diagram proceeds to the right to a get data block 140, which is similar to get data block 136, and then to a transmit data network block 142, similar to block 138.

From either a No decision in decisional block 130 or block 142, the logic flow diagram proceeds to decisional block 132 involving transmission of data on occupancy. If occupancy data is to be transmitted, the logic flow diagram proceeds to the left to block 144 to obtain the data from the A/D converter, and then proceeds to a motion detected decisional block 146 wherein a decision is made as to whether motion was detected or not. This also depends upon the selected mode of the PIR occupancy sensor, with different threshold values being utilized in the security and energy management modes. If motion was detected, the LED 64 is flashed at block 147, and the data is transmitted over the data transmission network at block 148 similar to at block 138. If no motion was detected in decisional block 146, or following the completion of transmission of data in block 148, the logic flow diagram proceeds to decisional block 134 for the transmission of data from any optional sensors, such as a CO or $CO_2$ sensor, relative humidity sensor or active infrared sensor at block 150. The logic flow diagram then proceeds to block 152 wherein the data is obtained, similar to block 136, and then to block 144 wherein the data is transmitted over the network, similar to block 138.

If the decision in decisional block 134 is No, the service switch is checked at block 156. If the service switch is operated, the unit's 48 bit unique identification number is transmitted over the data network at block 158. From either a No decision in block 156 or following blocks 158 or 154, the logic flow diagram proceeds to block 160, wherein a decision is made to whether network configuration information data has been received. This involves for instance data information from installation tools, wherein nodes may be added to the network, and also involves information and settings including application codes. If no network configuration information data has been received, the logic flow diagram proceeds back to block 128 to recycle back through the logic flow diagram. If network configuration information data has been received, the logic flow diagram proceeds to block 162, in which the network configuration information data is saved, and then back to block 102, in which the received network configuration information data is loaded into application memory. As stated previously, the network configuration information data includes data on setups (e.g. delta, min/max etc.) definitions for inputs, definitions of constants, etc., all as defined in the particular data communication network. The logic flow diagram then recycles back through itself.

One multifunction sensor with common data communications can replace many traditional individual sensors. Moreover, it enables much improved logic and decision making in building automation and control, including maximum performance in energy management and peak demand control as are used in Demand Side Management (DSM) systems. A low cost system design optimizes load shedding for electrical DSM systems by sensing and communicating occupancy, temperature and ambient light data to the DSM controller. Moreover, energy management and peak demand monitoring and control is optimized by the provision of simultaneous information on occupancy status, ambient temperature and light levels. This enables the HVAC, DSM and lighting controllers to make optimum decisions on shedding various HVAC, lighting, and other electrical loads, while simultaneously providing occupancy information for security monitoring and control. The multifunction sensor maximizes many systems' performance conveniently and economically.

For example, if peak energy demand is exceeded in the summer and temperatures and ambient light levels are high, then lighting loads can be shed in areas with sufficient ambient light. If demand is still exceeded, A/C loads can also be shed in those areas or zones which are unoccupied. In winter, the multifunction sensor can similarly optimize energy management of heating, lighting and other loads. Moreover, the multifunction sensor can provide detailed occupancy information over the system bus to the distributed control system security controller in the case of fire. In the case of unwanted intrusion, occupancy sensing can trigger the security controller during nonworking hours for an appropriate alarm with location/address information of the intruders and also trigger the lighting controller as needed.

Figure 12:
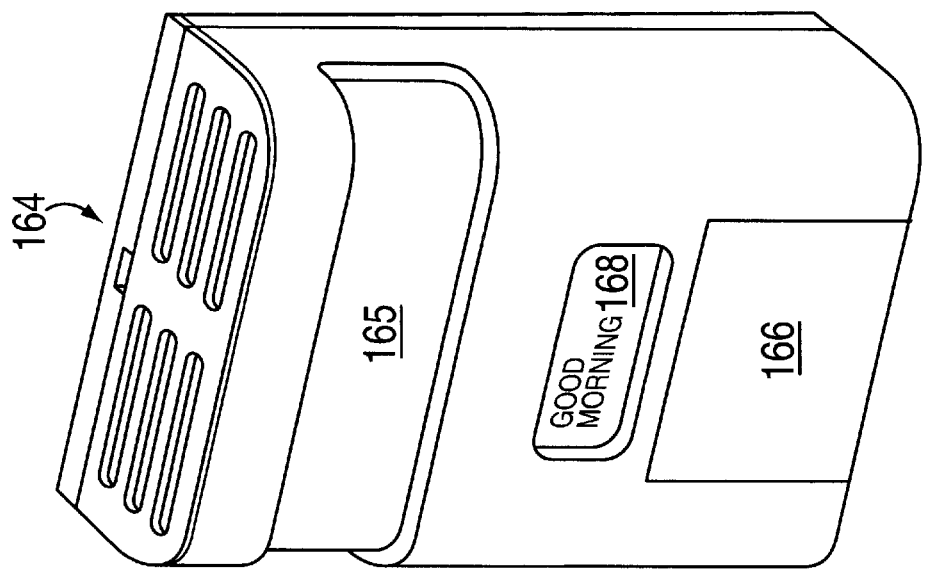
FIG. 12 is a front perspective view of a low profile global multifunction user interface pursuant to the present invention which provides a low profile streamlined combination keypad and sensor.

FIG. 12 illustrates a front perspective view of a multi-function user interface 164 pursuant to the present invention which provides a low profile streamlined combination keypad and sensor. The multifunction user interface 164 is provided as an add-on option to a more basic and lower cost sensor module which provides a plurality of parameter sensors in one sensor module, but does not provide a display or keypad to enable a person at the sensor module to access and control parameters of the system.

The multifunction user interface 164 is international and universal in its mounting capability and compatibility with virtually any country's wallboxes and surface mounting requirements. The universal compatibility is achieved by the use of different adapter mounting plates, if needed, which are positioned behind the sensor module 164, between the unit 164 and the different mounting receptacle boxes which are available in different countries. The aspect ratio is that of a typical U.S. wall plate (4.4"high×2.8" wide). The profile projection from the wall in a surface mount application is 1.1".

A window 165 is placed in front of the passive infrared (PIR) optics which blends aesthetically with the low profile housing in shape and color, and avoids an outward appearance of a curved Fresnel array, and provides a smooth continuation of the enclosure surfaces. The actual refractive IR optics and a passive infrared (PIR) sensor 167 are optimally positioned behind the window 165.

Keypad inputs from a keypad are located behind a door 166 which slides vertically downwardly to permit access to the individual controls of the keypad. A digital display 168 in the front cover is centrally located below the window 165 and above the door 166. A multiplicity of functions, such as occupancy heat, smoke, ambient temperature sensing for energy management and security, ambient light dimming, control and local override of lighting, HVAC, on/off, dimming, etc. are provided in a low profile, streamlined aesthetically attractive enclosure.

Figure 17:
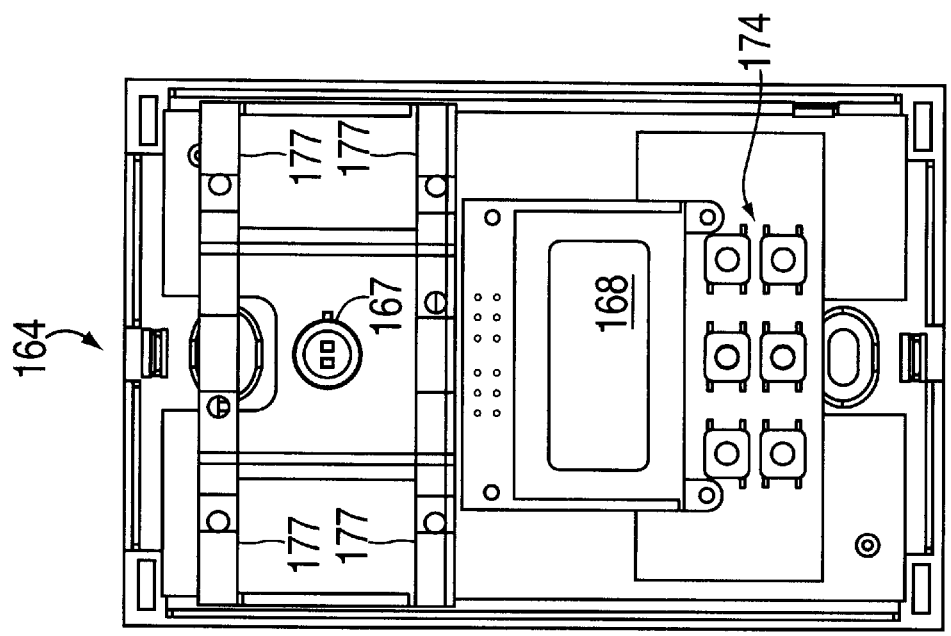
FIG. 17 is a front elevational view of the multifunctional user interface with the front cover removed, and illustrates the mounting at the top thereof for the window for the PIR optics, a digital display centrally located in the sensor, and the keyboard arrangement.

FIG. 17 is a front elevational view of the multifunction keypad/display with the front cover removed therefrom, and illustrates a mounting 177 at the top thereof for the window 165 for the PIR optics, a digital display 168 centrally located in the sensor, and the keyboard arrangement 174.

The multifunction user interface provides data communications over a system bus with any one of a multiple number of recognized control protocols—LONWORKS, CEBus, EIBus, etc., and also provides tamper-proof intrusion detection and closed loop security diagnostics/protection.

The multifunction user interface of the present invention is an add-on option to a more basic and lower cost sensor module which does not provide a display or keypad to provide a local user interface to the communications and control network. The add-on nature of the present invention will become more apparent from the detailed description hereinbelow. The multifunction user interface provides an optional keypad,/LCD user interface for local control and override of Lighting On/Off/DIM, temperature set, automatic light level set, display/readout data, a digital thermostat option, and also an option for dual technology occupancy sensing, wherein occupancy is sensed by two or more sensors, active or passive, using different technologies such as PIR, ultrasonic, acoustic, and radar, such as doppler or microwave impulse radar.

The multifunction user interface of the present invention provides an option for a local user override system which provides a keypad and display for a local user interface in which:

A flexible design enables a low cost basic unit with no keyboard/display. This is because all circuitry of the keypad/display option is provided on a plug-in PCB which plugs into and interfaces with a main PCB of the more basic and lower cost sensor module.

A dot matrix LCD display (or graphical display including touch panel types) allows user feedback of settings and control functions, and can be any size depending upon the particular application requirements.

A keyboard allows local user override and adjustment of functions, e.g. light level, blinds/curtains, temperature, etc.

An option for a back lighted display can be used as a night light/motion detector or indicator, and can also be turned off to reduce power when the lights are on or no one is in the area (except override off), as indicated by the PIR.

The keypad/display provides the user with a "point of control" and interactive control and feedback of light level, temperature, sunblind, security mode, etc. Generic or softkeys, which can implement various different functions, allow the display to allocate different functional assignments (in a menu driven mode) to the generic keys which are aligned under the respective display areas, which in turn select and control the appropriate function prompted by the display.

Figures 13, 14:
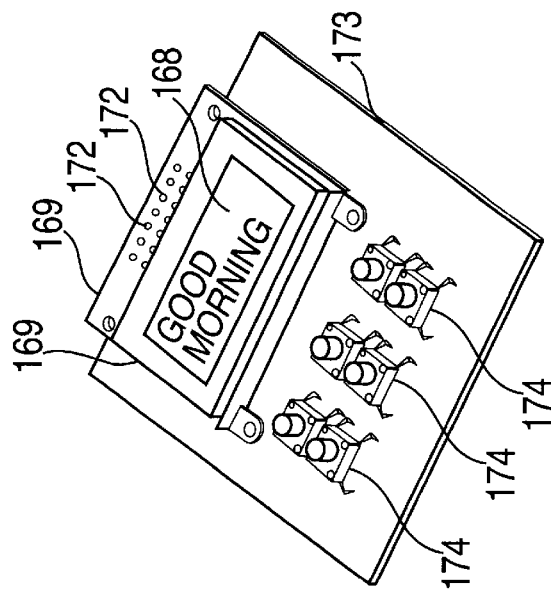
FIG. 13 illustrates a variety of typical display functions.
FIG. 14 illustrates a keypad/display printed circuit board which is designed as a plug-in board to a main printed circuit board of the basic sensor module.

FIG. 13 illustrates a variety of typical display functions, including display functions on temperature, light, security, override, temperature setback and scheduling, sunblinds, screens, etc.

FIG. 14 illustrates a keypad/display PCB which is designed as a plug-in board 173 to a main PCB board 176, as illustrated in more detail in FIGS. 16 and 18, to allow a low cost unit to share the main PCB 176, therefore, all respective feature costs are partitioned. This design allows a range of products to be built, from a lower end product to minimize cost and provide basic functionality (PIR, temperature and ambient light) to a high end product with a rich feature set including user interfaces and additional parametric sensor inputs.

Figure 15:
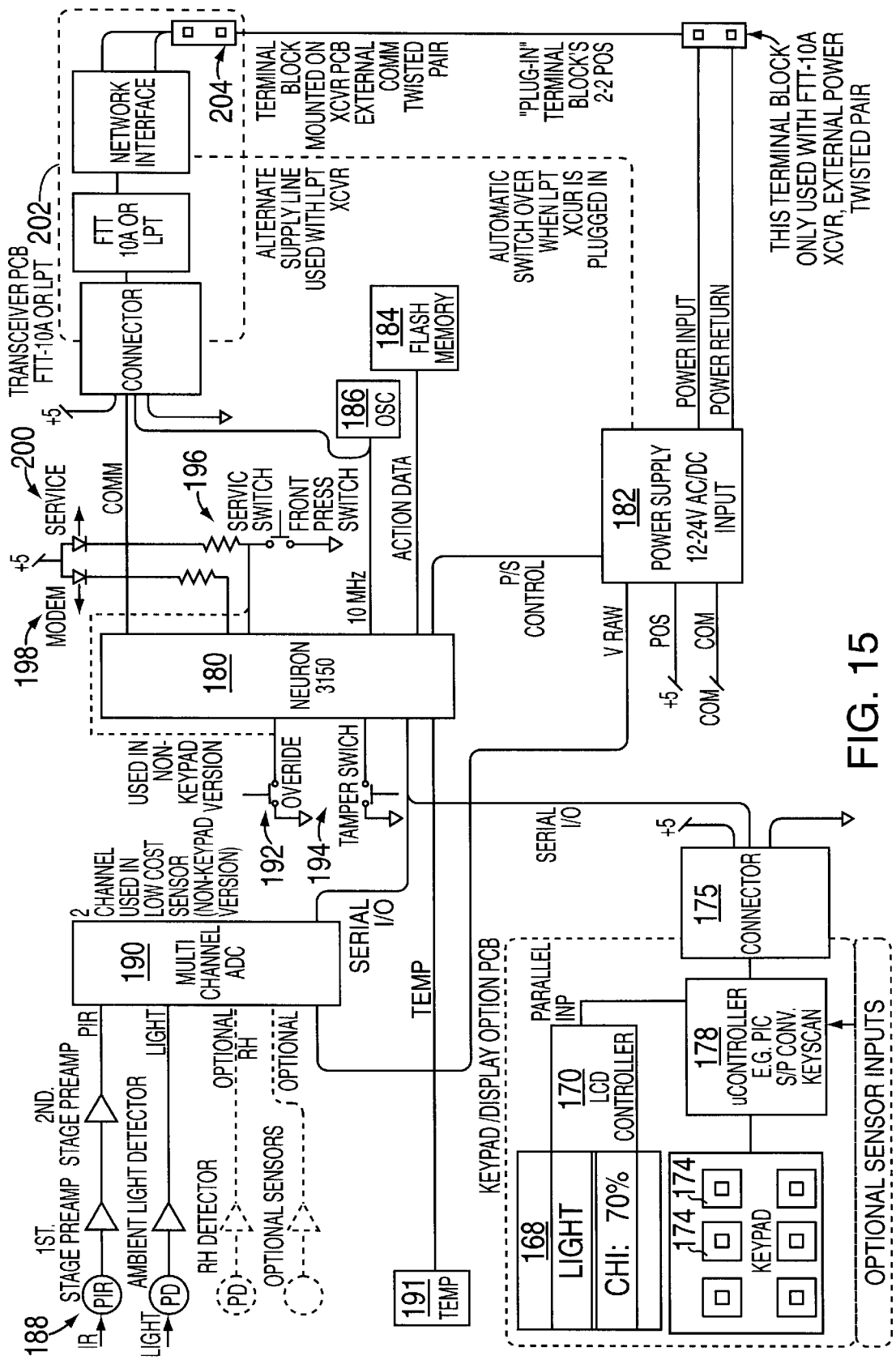
FIG. 15 illustrates an electrical block diagram for the multifunction user interface circuit and also for the basic sensor module and the connections therebetween.

FIG. 14 illustrates a display module PCB 169 which includes a display (LCD) controller 170, FIG. 15, mounted thereon, which is available commercially as one unit. Referring to FIGS. 14, 16 and 18, the PCB 169 is mounted by support bosses 171 and an electrical interconnect 172, which can be a header or ribbon cable, to a further keypad/controller PCB 173. The PCB 173 is in turn mounted by support bars 174 and an electrical connect header 175 to the main PCB 176 of the unit. The plug-in board 173 is shown in FIG. 14 with the display PCB 169 and an array of entry keypad touch switches 174.

The display 168 can use a 2 line by 8 character 5×8 dot matrix LCD module 169 with or without a back light option. The LCD module 169 includes a controller 170, FIG. 15, with a font library in memory. Other larger type displays (e.g., 4 line by 16 character, including graphical touch panel) can be implemented dependent upon the particular application requirements. In some embodiments, the display 168 can be a graphical touch panel which utilizes and displays a graphical icon based touch and enter input, e.g, display the "lights on" in graphics, and select that control function by touching the picture, and then turn the lights off or dim by sliding an icon (graphical) potentiometer.

A commercially available back light option allows features such as motion and night light (during override off) modes to be indicated. It can also be turned off to conserve power when the area is vacant, as determined by the PITR sensor, or required by a security "dark mode" so as not to be noticed.

Typical keypad functions include light control, dimming, light scene select, security on/off, etc.

FIG. 15 illustrates an electrical block multifunction user interface circuit includes the display 168 controlled by a controller 170, and a keypad input 174 controlled by a keypad. microcontroller 178, which are connected through the header 175 to the main PCB 176. The microcontroller 178 converts a serial I/O from the Neuron controller 180 to a parallel I/O fior the display. The main PCB 176 includes a Neuron 3150 controller 180, a 12–24V ac/dc power supply 182, a flash memory 184 which contains programs for the controller 180, an oscillator/clock 186, inputs 188 from various sensors, PIR (Passive Infrared), light, RH (Relative Humidity), etc. which are directed through preamplifiers to a multichannel ADC (Analog/Digital Converter) 190, and a direct input from a temperature sensor 191. An override switch 192, tamper switch 194, and a front service switch 196 also form inputs to the controller 180. A motion detector LED 198 and service LED 200 provide visual outputs or the front of the unit. The circuit is connected by a transceiver 202 to interface through a plug-in terminal block 204 with other nodes of the control network. The transceiver 202 is interchangeable to allow different transceiver types, depending upon the particular network, e.g. FTT (free topology), LPT (Link Power Transceiver), or RF transceiver, etc.

The temperature sensor 191 can provide a digital output signal, wherein the keypad/display is used for setting of temperature, and functions such as setback temperature, etc., such as provided for in LonMark Profile 8060.

Scheduler/real time clock (RTC) data is imported from other nodes on the network to select time of day or 7 day timing functions, e.g. set the temperature to 68 degrees at 8:00 a.m. Saturday and Sunday to 10:00 p.m., set the temperature to 68 degrees at 5:30 a.m. Monday-Friday to 7:00 p.m., then set the temperature back to 58 degrees, etc.

FIG. 16 is a sectional side view of the package layout of the multifunctional keypad display 164 with a first embodiment of a tamper switch 194. The tamper switch 194 is a spring-loaded pushbutton switch which is mounted to the back of the main PCB board, to contact a mounting surface such a wall, such that if the multifunction user interface unit is removed from its mounted position against a wall, the spring-loaded pushbutton extends and closes (or opens) the switch, which is an input to the controller 180.

FIG. 18 is a sectional side view of the package layout of the keypad display with a second embodiment of a tamper switch 194' which comprises a remote actuator in the form of a hinged leaf spring. A hinged plastic leaf spring design, as illustrated in FIG. 18, ensures that a remote contact point is available by placing the spring at a mounting boss. This is a concern in instances wherein the unit is mounted within an electrical outlet box and the hinged leaf spring extends to a position near a mounting flange of the electrical outlet box (the switch contact cannot extend into the void of an open electrical outlet box).

The security/tamper switch 194 or 194' provides an input to the Neuron controller 180 which reports an alarm signal to the network immediately if the unit is removed from the wall or the sensor cover is removed. The main printed circuit board is mounted to the front cover, and so either removal of the front cover or removal of the unit from a mounting surface will trigger the tamper switch. A single switch 194 or 194' detects both cover and wall removal, and generates a "tamper" alarm network message (which includes the sensor ID) which informs the network that this particular sensor has been tampered with.

Additional sensors for temperature, RH, heat, pressure, sound, air quality ($CO_2$, CO, pollution), humidity, etc. sensors, as well as closed loop security inputs from external contacts, can be connected to the multifunction user interface unit 164.

For additional verification or larger area coverage outside of the field of view of the PIR 167 that a security breech has occurred or that someone has entered or exited the space, a pressure transducer can be utilized to detect a positive or negative pressure shift relative to a normal (differential) measurement.

An adaptive Timing (AT) feature which is programmed in software profiles an occupant via a software algorithm, e.g. digital signal processing (DSP), slew rate filter, waveform recognition, etc. to determine an optimized time out delay for turning off the lighting. The AT feature allows timing to be optimized for both energy savings (for the shortest delay of leaving the lights on after an occupant has left the area) as well as lessening the probability of turning off the lights when an occupant is still in the area (nuisance lights off).

The AT software resides in a combination sensor/controller or a dedicated controller device which provides the timing function. The AT feature can be set as a manufacture specific variable, e.g. normal non-AT or AT mode. A factory default can enable the AT mode or else it can be configured by a network management tool.

Sensor functions and features can be transported to and be adapted to work within any network protocol, e.g. LonWorks, CEBus, EIBus, etc.

Figure 19:
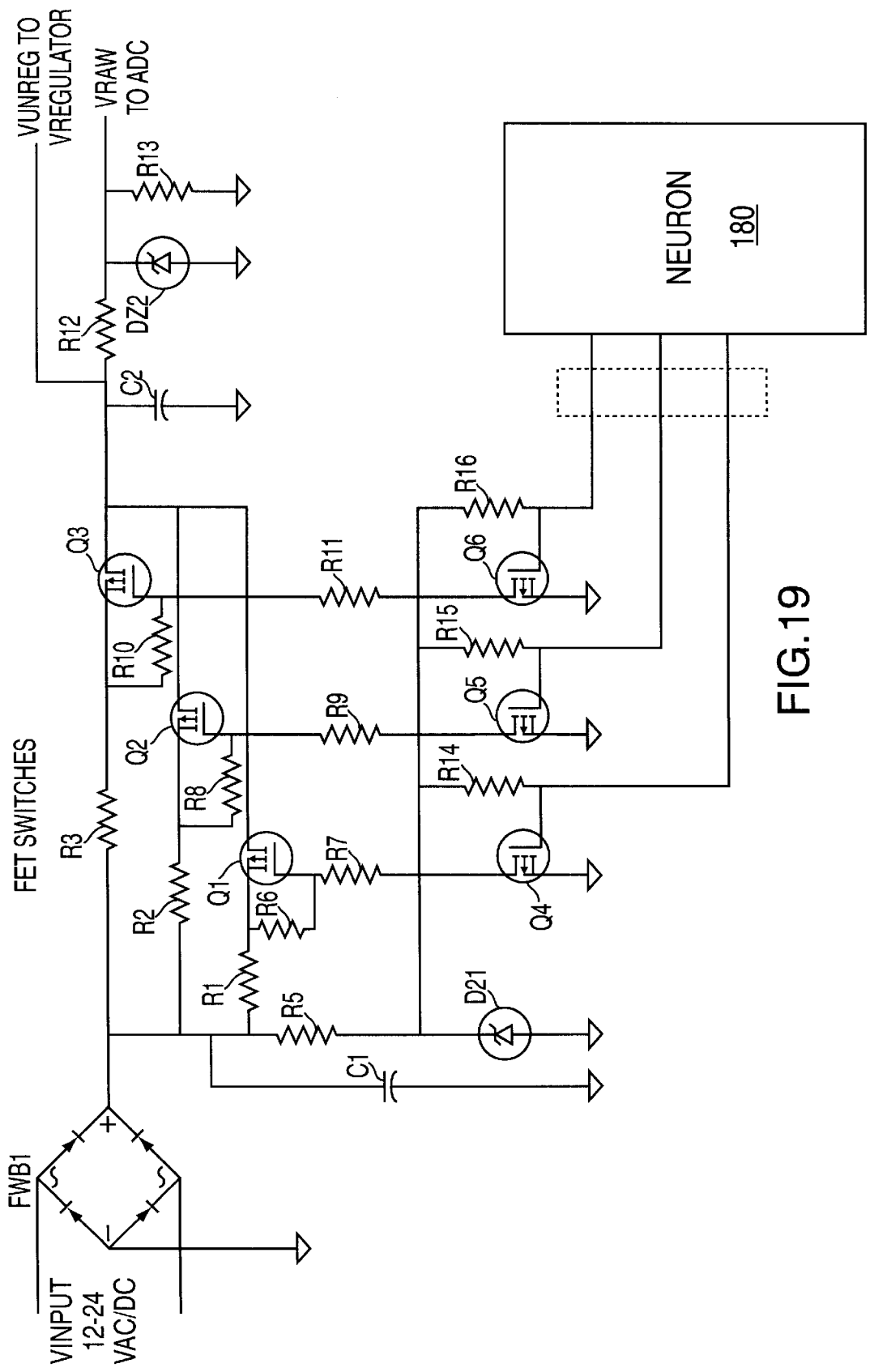
FIGS. 19 and 20 illustrate two different embodiments of power supply circuits for a smart AC/DC Vrange power supply which provide auto compensation for an internal heating error due to a range of power supply operating voltages e.g. 12–24 Vac/dc.
Figure 20:
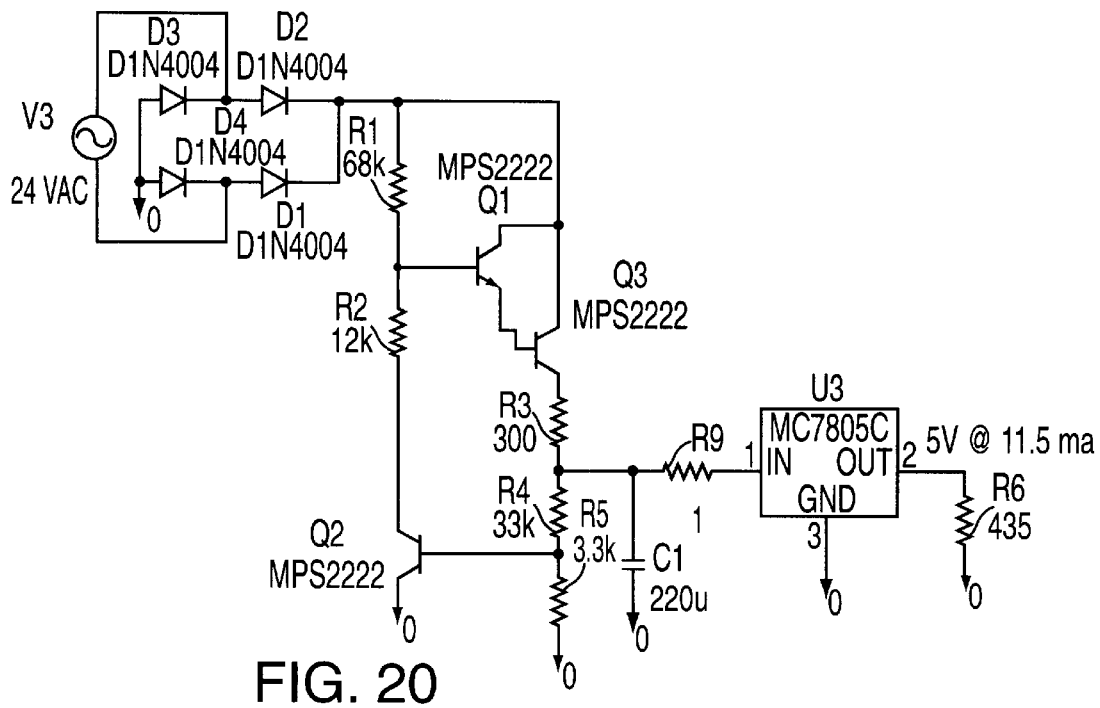

FIGS. 19 and 20 illustrate two different embodiments of power supply circuits for a smart AC/DC Vrange power supply (P/S) which provides auto compensation for an internal heating error due to a range of power supply operating voltages, e.g. 12–24 Vac/dc. The objective of these circuits is to reduce power dissipation in the power supply components because less power dissipation means less temperature error between the actual room temperature near the outside of the sensor module and the temperature measured by the temperature sensor inside the sensor module.

These circuits allow the sensor circuit to be connected to an input range of 12–24Vac or dc, for example, without the need for the user to manually select a narrower range, e.g. 12Vac or 24Vdc, etc. to optimize the circuit for minimal internal thermal dissipation. This benefits the temperature sensor function by not allowing the self-heating error (dissipation of the power supply) to be offsetting (adding to) to the actual space temperature.

FIG. 19 illustrates a circuit in which the Neuron controller 180 monitors the power supply filtered but unregulated voltage (Vraw) at a scaled level at the analog to digital converter (ADC) 190 input, and dynamically regulates the input power (via current limit resistor switching, frequency modulation, shunt, etc. methods) to minimize the $I^2R$ power loss.

Default at startup is at the highest current "let through" (results in the fastest power up and a best case start up for a low voltage input scenario), and after all initialization is completed, the sensor is ready for operation at the lowest P/S dissipation optimized level.

The power supply circuit of FIG. 19 selects 1 of 7 possible power levels in dependence upon the input by selecting 1 of 7 possible combinations of current limit resistors R1, R2 and R3 to minimize internal thermal dissipation (self heating) in accordance with the following Truth Table.

TRUTH TABLE

| R3 | R2 | R1 | level |
|----|----|----|-------|
| 0  | 0  | 0  | n/a   |
| 0  | 0  | 1  | 1     |
| 0  | 1  | 0  | 2     |
| 0  | 1  | 1  | 3     |
| 1  | 0  | 0  | 4     |
| 1  | 0  | 1  | 5     |
| 1  | 1  | 0  | 6     |
| 1  | 1  | 1  | 7     |

In the circuit of FIG. 19, an input voltage (Vinput) AC is rectified by a full wave bridge rectifier FWB1. If DC, then the bridge rectifier FWB1 conducts regardless of input polarity. A capacitor C1 provides filtering, while resistor R5 limits the current to zener diode DZ1 which clamps the voltage to the pull up resistors R14-R16 to less than or equal to 5Vdc. These resistors supply the gate to source voltage (VGS) to turn on MOSFET drivers Q4–Q6 which supply VGS to all of the switching FETs Q1–Q3 which connect all three current limit resistors R1–R3 in parallel. For the series configuration, resistors R2–R4 are shorted. This provides the lowest resistance value/maximum current start the circuit in operation. Once the Neuron microcontroller is out of reset, it samples the unregulated voltage level of filter capacitor C2 through resistance divider R12 and R13. The zener diode DZ2 across resistor R13 clamps the voltage to 5.1V max. This ensures that the maximum input level of the analog to digital converter (ADC) is not exceeded. Resistors R12 and R13 yield 5V (full scale for the ADC) when the input supply is at a maximum "high line" egg. 28V, and provides a scaled voltage of Vunreg for lower Vinput levels (for an 8 bit converter 1 bit/256=19.5 mV/bit . . . 5/256).

The microcontroller continuously samples Vraw through the ADC and switches resistors R1–R3 or R2–R4 to maintain a minimum input to output voltage differential required by the voltage regulator to stay in regulation and allow the current to be selectively shared/limited to minimize the thermal dissipation of the resistors and the voltage regulator. Power is distributed to the resistor and the voltage regulator depending upon the PC board layout to minimize the temperature elevation in proximity to the temperature sensor/PIR sensor. This allows minimum internal self heating which allows the temperature sensor to more accurately track the real space temperature.

FIG. 20 is an electrical schematic of a circuit for maintaining the regulator input voltage slightly above a minimum input level required for proper regulator operation. The circuit minimizes power dissipation in a voltage regulator U3. In operation, the transistor Q2 turns off when the regulator U3 input voltage drops below a minimum desired level, e.g. 1.5 volts above the regulated output voltage, and transistor Q2 turns on again when the regulator input voltage has risen by approximately 0.5 volts.

This power dissipation minimization circuit does not operate to reduce the total power dissipation, but it does allow control of where the power is dissipated e.g., it greatly reduces the power dissipation in the voltage regulator which might have to be located in a more thermally sensitive area (close to the temperature or PIR sensor) of the PC board. The power dissipation is transferred to the transistor Q3. The circuit can eliminate requirement for a 27 V zener diode, as $V_{ceo}$=40 volts and $V_{cbo}$=75 volts for transistors Q2 and Q3.

A plug and play network device configuration feature allows binding of nodes with different pre-programmed configurations in known device installations (product type and quantity) e.g. lighting: Setting 1=Incandescent=zone 1 level a, Fluorescent=zone 2 level c; Setting 2=Incandescent=zone 1 level b, Fluorescent=zone 2 level a, etc.

Pursuant to a Neuron processor shared service pin feature, a Lonworks smart device always has at least one push button for its Neuron service pin network function. A service pin is normally used only while the device is in installation. (It enables the Neuron Chip ID# to be read).

A Neuron service pin sharing feature allows the hardware resources of a smart device to be better utilized. It also provides smart device features at a lower cost and in a smaller package.

Figure 21:
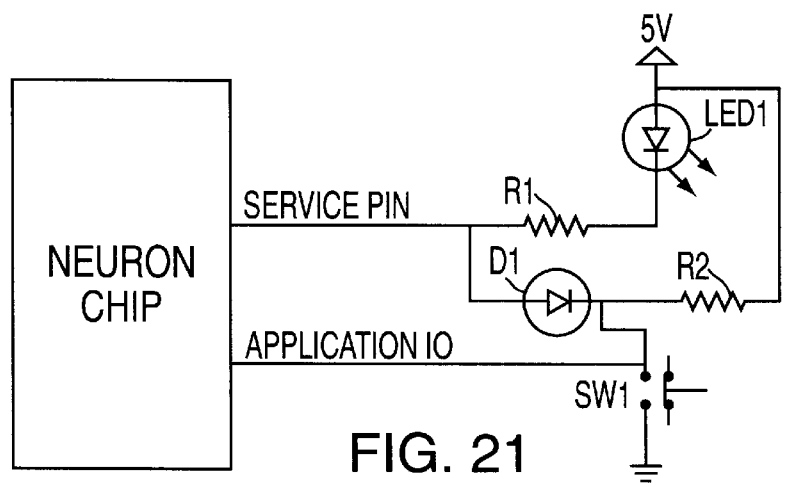
FIG. 21 illustrates a schematic circuit to provide Neuron service pin sharing.

FIG. 21 illustrates a schematic circuit to provide Neuron service pin sharing. A single push button switch is shared by an application IO port and also by the service pin. Before installation, the device does not give any response to an application IO input and the device physically does nothing. After the device is installed, a switch input signal is sent to the application for desired operations. The switch signal is also coupled to the service pin. However, any input from the service pin does not impact upon the device application. On the other hand, the Neuron will occasionally flash the LED1 with the service pin for network behaviors. This switch operation is blocked by D1 and has no impact upon the application IO. Therefore, SW1 provides all of the functions required by both the service pin and the application IO with no interference therebetween.

While several embodiments and variations of the present invention for a multifunction user interface are described in detail herein, it should be apparent that the disclosure and teachings of the present invention will suggest many alternative designs to those skilled in the art.

What is claimed is:

1. A multifunction user interface provided as an add-on option to a more basic multifunction sensor which does not provide a display or keypad to provide a local user interface to access and control parameters of a control network, wherein:

the basic multifunction sensor provides a plurality of parameter sensors in one sensor housing which can interface with and control operation of one or more processor control systems connected by a network bus in an occupied space networked environment, and comprises an occupancy sensor and a temperature sensor, and a common network communications and control processor coupled to a common communication transceiver which are shared in common by the occupancy sensor and the temperature sensor, such that the basic multifunction sensor can interface with and control operation of one or more distributed processor control systems for control of an occupied space networked environment; and the multifunction user interface comprises a display and a keypad input, which are physically mounted to and on the basic multifunction sensor, controlled by a controller, and which are electrically coupled to the communications and control processor to provide a local user interface to access and control parameters of the control network.

2. A multifunction user interface as claimed in claim 1, wherein the multifunction user interface is provided on a plug-in printed circuit board which plugs into and interfaces with a main printed circuit board of the basic multifunction sensor.

3. A multifunction user interface as claimed in claim 2, wherein the plug-in printed circuit board comprises a keypad/controller printed circuit board, on which is mounted a display/controller printed circuit board.

4. A multifunction user interface as claimed in claim 3, wherein the plug-in printed circuit board is mounted by supports and an electrical connector to the main printed circuit.

5. A multifunction user interface as claimed in claim 1, wherein the basic multifunction sensor and the multifunction user interface allow a range of products to be built, from a lower end product to minimize cost and provide basic functionality, to a high end product with a rich feature set including user interfaces and additional parameter sensor inputs.

6. A multifunction user interface as claimed in claim 1, wherein the keypad includes generic keys to allow the display to allocate different functional assignments, in a menu driven mode, to the generic keys which in turn select and control an appropriate function.

7. A multifunction user interface as claimed in claim 1, wherein scheduler/real time clock data is imported from other nodes on the network bus to select time of day or seven day timing functions.

8. A multifunction user interface as claimed in claim 1, wherein additional parameter sensors are connectable to the multifunction user interface or the basic multifunction sensor.

9. A multifunction user interface as claimed in claim 1, wherein the display comprises a graphical touch panel which utilizes and displays a graphical icon based touch and enter input, and a control function is selected by touching the display, and then controlled by sliding a graphical icon thereon.

10. A multifunction user interface as claimed in claim 1, wherein a multifunction user interface enclosure housing includes a window placed in front of a passive infrared occupancy sensor which provides an aesthetically smooth continuation of the enclosure housing.

11. A multifunction user interface as claimed in claim 1, wherein the keypad is located behind a door to permit access to individual controls of the keypad.

12. A multifunction user interface as claimed in claim 10, wherein a digital display is centrally located above the door.

13. A multifunction user interface as claimed in claim 2, wherein a tamper switch is mounted to the back of the main printed circuit board, to contact a mounting surface, such that if the multifunction user interface unit is removed from its mounted position, the tamper switch signals an input to the control processor.

14. A multifunction user interface as claimed in claim 13, wherein the tamper switch comprises a spring-loaded push button switch.

15. A multifunction user interface as claimed in claim 13, wherein the tamper switch comprises a remote actuator hinged leaf spring to ensure that a remote contact point is available by placing the hinged leaf spring at a mounting boss.

16. A multifunction user interface as claimed in claim 13, wherein the main printed circuit board is mounted in a sensor front housing cover such that the tamper switch reports an alarm signal if the unit is removed from its mounting or the sensor front housing cover is removed.

17. A multifunction user interface as claimed in claim 2, wherein the main printed circuit board includes a controller, an ac/dc power supply, a memory containing programs for the controller, a clock, inputs from parameter sensors, and the controller is connected by a transceiver to interface with other nodes of the control network.

18. A multifunction user interface as claimed in claim 17, wherein the transceiver interfaces through a plug-in terminal block with other nodes of the control network, and the transceiver is interchangeable to allow the utilization of different transceiver types, depending upon the particular type of network.

19. A multifunction user interface as claimed in claim 1, wherein the keypad microcontroller converts a serial input/output from the common network processor to a parallel input/output for the display.

20. A multifunction user interface as claimed in claim 1, wherein the basic multifunction sensor module includes a smart power supply circuit which provides auto compensation for an internal heating error due to a range of power supply operating voltages, to allow the sensor circuit to be connected to an input range of 12–24Vac or dc without the need for a user to manually select a specific setting, to selectively minimize internal thermal dissipation.

21. A multifunction user interface as claimed in claim 20, wherein the smart power supply circuit utilizes the network processor to monitor the power supply filtered but unregulated voltage, and dynamically regulates the input power by current limit resistor switching to selectively distribute power dissipation.

22. A multifunction user interface as claimed in claim 21, wherein the smart power supply circuit selects power levels or varying input voltages in by selecting combinations of input current limit resistors to selectively minimize internal thermal dissipation.

23. A multifunction user interface as claimed in claim 1, wherein the common network processor is connected to a service switch which is shared by an application input/output port and also by service operations.

* * * * *